United States Patent [19]
Hase et al.

[11] Patent Number: 5,965,057
[45] Date of Patent: *Oct. 12, 1999

[54] PIEZOELECTRIC CERAMIC AND MANUFACTURING METHOD THEREOF

[75] Inventors: Kiyoshi Hase, Ishikawa-ken; Hiroshi Takagi, Ohtsu; Akira Ando, Ohmihachiman; Akira Nagai, Tsuzuki-gun; Yu Tokuda, Muko; Koichi Hayashi, Shiga-ken, all of Japan

[73] Assignee: Murata Manufacturing Co., Ltd., Japan

[*] Notice: This patent issued on a continued prosecution application filed under 37 CFR 1.53(d), and is subject to the twenty year patent term provisions of 35 U.S.C. 154(a)(2).
This patent is subject to a terminal disclaimer.

[21] Appl. No.: 08/726,746

[22] Filed: Oct. 7, 1996

[30] Foreign Application Priority Data

Oct. 6, 1995 [JP] Japan .................... 7-260229

[51] Int. Cl.$^6$ .................... C04B 35/491; C04B 35/493; C04B 35/49
[52] U.S. Cl. .................... 252/62.9 PZ; 501/134
[58] Field of Search .................... 252/62.9 PZ; 501/134

[56] References Cited

U.S. PATENT DOCUMENTS 5,403,788  4/1995  Nishida et al. .................... 501/134

FOREIGN PATENT DOCUMENTS 0575966   6/1993   European Pat. Off. .
575966   12/1993   European Pat. Off. .
0773594A1 5/1997   European Pat. Off. .

*Primary Examiner*—C. Melissa Koslow
*Attorney, Agent, or Firm*—Ostrolenk, Faber, Gerb & Soffen, LLP

[57] ABSTRACT

There is provided a piezoelectric ceramic having a small mechanical factor of merit Qm and excellent heat-resisting properties, e.g., a piezoelectric ceramic for filter elements which is compatible with surface mounting and a method of manufacturing the same in a large amount and in a stable manner. There is provided a piezoelectric ceramic which is a composite oxide of at least lead, zirconium and titanium, wherein an oxide of manganese exists in a grain boundary layer in a density higher than that in a crystal grain of the piezoelectric ceramic and a glass phase exists in the grain boundary layer. It is manufactured by depositing a manganese compound and a glass material on the surface of a piezoelectric ceramic comprising a composite oxide of at least lead, zirconium and titanium and by performing thermal processing thereafter to diffuse the deposited substance in a grain boundary portion of the piezoelectric ceramic.

20 Claims, 4 Drawing Sheets

PIEZOELECTRIC CERAMIC AND MANUFACTURING METHOD THEREOF

BACKGROUND OF THE INVENTION

1. Field of the Invention

The present invention relates to a piezoelectric ceramic to be used in surface mount type piezoelectric components which must be resistant to heat and a method of manufacturing the same.

2. Description of the Related Art

As piezoelectric ceramics used in ceramic filters and the like, piezoelectric ceramics mainly composed of lead zirconate titanate (PZT or $Pb(Ti_xZr_{1-x})O_3$) or the like have been widely used. Materials used for ceramic filters which have excellent characteristics in that group delay time (GDT) characteristics are flat and phase distortion is small, must have a small mechanical factor of merit Qm. In order to improve the piezoelectric characteristics of such ceramics, various additives in very small amounts have been added to them. Known materials include those obtained by adding niobium oxide, antimony oxide, tantalum oxide and the like as additives to lead titanate zirconate and those obtained by substituting rare earth elements such as Sr, Ba, Ca and La for a part of Pb atoms in lead titanate zirconate.

However, piezoelectric ceramics having a small Qm value as described above have had a shortcoming in that even such a ceramic having a high Curie point suffers shifts in resonant and antiresonant frequencies at elevated temperatures because of a decrease in the electromechanical coupling factor K when the electrodes formed on both ends of the piezoelectric ceramic are opened. This has resulted in a problem in that such a ceramic used as a surface mount type filter element suffers reduction in filter characteristics when exposed to a high temperature (about 250° C.) during reflow soldering.

As a solution to this problem, it has been reported that the specific resistance of a grain boundary portion of a piezoelectric ceramic having a small Qm value and a high Curie point can be reduced to improve heat-resisting properties by thermally diffusing a manganese compound from the surface of the piezoelectric ceramic to distribute an oxide of manganese unevenly so that it concentrates in the grain boundary layer in a high density. See, e.g., JP-A-6-1655, JP-A-6-1656 and JP-A-1657.

However, there has been a problem from the viewpoint of manufacture in that the thermal diffusion of the manganese compound from the surface of the piezoelectric ceramic causes a change in the structure of the grain boundary of a piezoelectric ceramic which has been sintered in advance and in that characteristics significantly vary if the amount of Pb in the piezoelectric ceramic fluctuates due to evaporation during manufacturing or if the temperature distribution in the thermal diffusion furnace is great. Therefore, it has been difficult to perform thermal diffusion in a large amount and in a stable manner, which has made the reduction in the specific resistance of a grain boundary portion insufficient to improve heat-resisting properties.

It is therefore an object of the present invention to provide a piezoelectric ceramic in which the above-described problems are solved and which has a small mechanical factor of merit Qm and excellent heat-resisting properties, e.g., a piezoelectric ceramic for filter elements which is compatible with surface mounting and a method for manufacturing the same in a large amount and in a stable manner.

SUMMARY OF THE INVENTION

A copending application (application Ser. No. 08/729,733, filed Oct. 7, 1996; P/1071-213), now U.S. Pat. No. 5,766,502 piezoelectric ceramic including an oxide of lead in the grain boundary layer in addition to an oxide of manganese. The inventors found that to form a glass phase in the grain boundary layer is also effective to improve the characteristics of the piezoelectric ceramic.

According to a first aspect of the present invention, there is provided a piezoelectric ceramic including at least a composite oxide of lead, zirconium and titanium, characterized in that an oxide of manganese exists in a grain boundary layer in a density higher than that in a crystal grain of the piezoelectric ceramic and a glass phase exists in the grain boundary layer.

According to a second aspect of the present invention, there is provided a method of manufacturing a piezoelectric ceramic, characterized in that a manganese compound and a glass material are deposited on the surface of a piezoelectric ceramic including at least a composite oxide of lead, zirconium and titanium, and thermal processing is performed thereafter to diffuse the deposited substances in a grain boundary portion of the piezoelectric ceramic.

Since the oxide of manganese is distributed in the grain boundary layer at a density higher than that in a crystal grain of a piezoelectric ceramic and a glass phase exists in the grain boundary layer, the specific resistance of the piezoelectric ceramic can be reduced to improve heat-resisting properties.

Further, when thermal processing is performed in the method of manufacture of the present invention on a manganese compound and a glass material deposited on the surface of a piezoelectric ceramic, the glass material melts on the surface of the piezoelectric ceramic at the diffusion temperature. This facilitates the migration of the manganese compound to the grain boundary portion of the piezoelectric ceramic, thereby allowing uniform diffusion in a wide temperature range. In addition, even when the amount of Pb in the grain boundary portion of the piezoelectric ceramic is small, the glass material which has melted on the surface allows the diffusion of the manganese compound into the grain boundary to be promoted.

Accordingly, the specific resistance of a PZT type piezoelectric ceramic can be reduced to improve heat-resisting properties, and a manganese compound can be thermally diffused in the piezoelectric ceramic in a large amount and in a stable manner without being affected by variations of the temperature in the diffusion furnace, fluctuations in the amount of Pb in the piezoelectric ceramic, and changes in the grain boundary structure and components of the piezoelectric ceramic.

It is therefore possible to provide a piezoelectric ceramic having a small mechanical factor of merit Qm, a large electromechanical coupling factor K, and excellent heat-resisting properties because of a reduced specific resistance, e.g., a piezoelectric ceramic for filter elements which is compatible with surface mounting and to manufacture it in a stable manner.

DETAILED DESCRIPTION OF PREFERRED EMBODIMENTS

Figure 1:
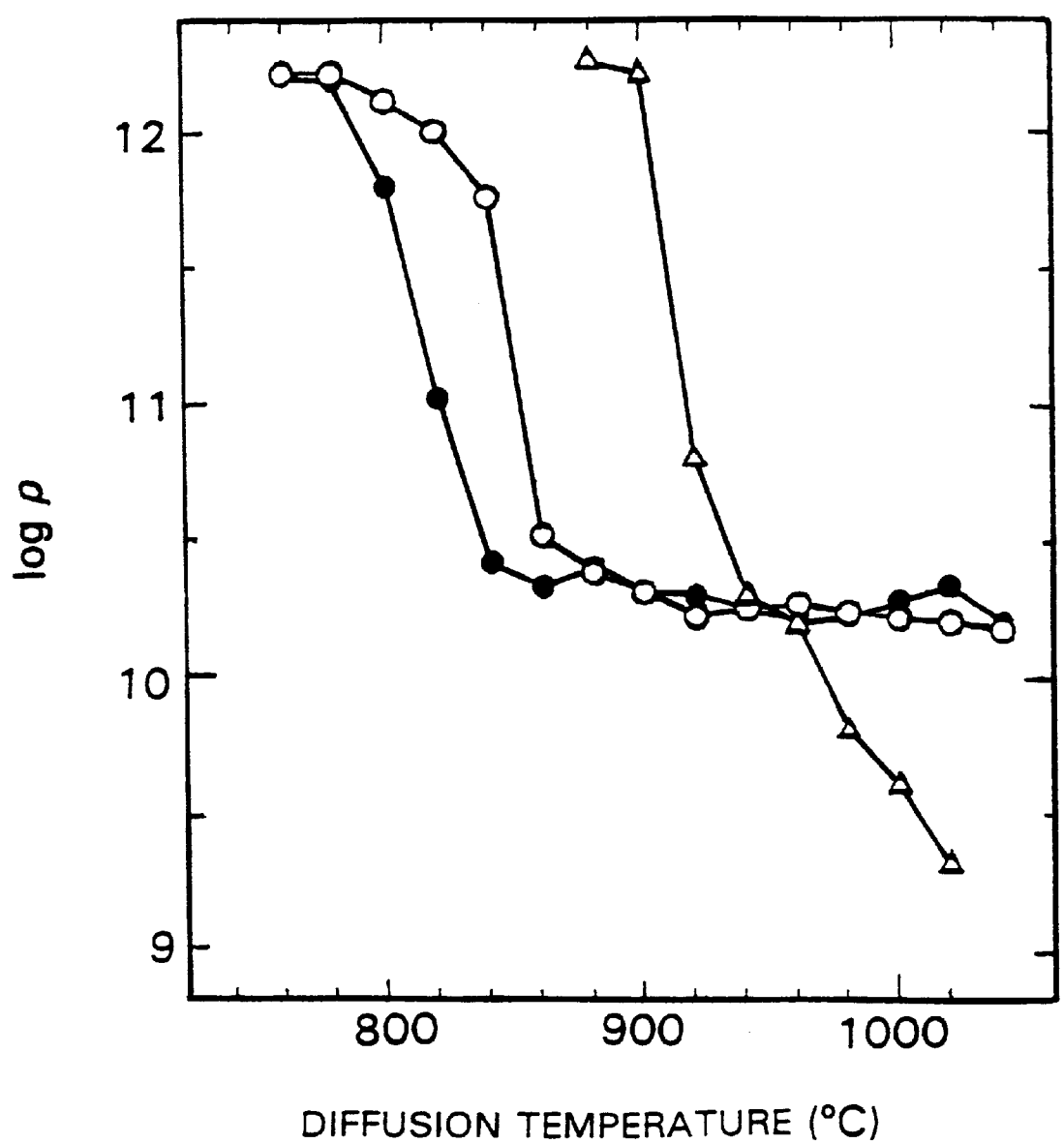
FIG. 1 is a graph showing changes in specific resistance ρ relative to diffusion temperatures according to a first embodiment of the present invention.

A first embodiment of the present invention will now be described.

First, a piezoelectric ceramic was produced by depositing a manganese compound and a glass material on the surface of a piezoelectric ceramic composition and by performing thermal processing to diffuse the deposited substance into a grain boundary portion.

Specifically, as starting materials, powders of PbO, SrO, $La_2O_3$, $TiO_2$ and $ZrO_2$ were prepared which are materials that constitute a piezoelectric ceramic having a small mechanical factor of merit Qm. Those powders were weighed to obtain a ceramic represented by $(Pb_{0.95}Sr_{0.03}La_{0.02})(Zr_{0.51}Ti_{0.49})O_3$ which was mixed with water and subjected to dry type mixing using a ball mill.

The resultant mixture was dried and then calcinated for two hours at a temperature in the range from 800 to 900° C. The calcinated material was mixed with a small amount of polyvinyl alcohol and water and was subjected to press molding at a pressure of 1000 Kg/cm². The resultant molded element was burned for two hours at a temperature in the range from 1100 to 1250° C. to obtain a ceramic in the form of a rectangular plate having a size of 20×30 mm and a thickness of 1 mm.

Meanwhile, $MnCO_3$ powder and borosilicate lead glass were weighed to obtain respective predetermined amounts which satisfy weight ratios of 3:7 and 5:5 and were mixed with varnish to produce two types of paste for thermal diffusion.

Next, the two types of paste were applied to the surface of separate ceramics as described above by means of screen printing. After drying, thermal processing was performed for two hours at a temperature in the range from 750 to 1100° C. to diffuse the manganese compound. These ceramics were then polished to a thickness in the range from 0.3 to 0.8 mm. Silver electrodes were applied to both end faces of the ceramics and baked. Thereafter, a polarization process was performed by applying an electric field in the range from 2 to 3 kV/mm for 30 minutes in insulating oil (temperature was in the range from the room temperature to 100° C.) to obtain piezoelectric ceramics.

The resultant piezoelectric ceramics were cut into a form of a square plate of 5×5 mm and the specific resistance ρ and the electromechanical coupling factor K at spreading vibration were measured.

A second embodiment of the present invention will now be described.

A piezoelectric ceramic was produced by depositing a mixture obtained by performing thermal processing on a manganese compound and lead type glass on the surface of a piezoelectric ceramic composition and by performing thermal processing to diffuse the deposited substance into a grain boundary portion.

Specifically, a ceramic in the form of a rectangular plate having a size of 20×30 mm and a thickness of 1 mm was first prepared in the same manner as in the first embodiment.

Meanwhile, a glass including manganese mixture was obtained by weighing $MnCO_3$ and lead type glass, melting them by means of thermal processing in a crucible, and quenching them. The mixture was combined with varnish in the same manner as in the above-described first embodiment to obtain a paste for thermal diffusion. It is not essential that the mixture obtained after quenching is uniformly amorphous and, for example, it may include the manganese compound and manganese silicate or the like, i.e., a silicon compound which is a component of the glass material.

Next, the paste for thermal diffusion of manganese thus produced was applied to the surface of the ceramic by means of screen printing, and a piezoelectric ceramic was obtained thereafter in the same manner as in the first embodiment.

The resultant piezoelectric ceramic was cut into a form of square plate of 5×5 mm and the specific resistance ρ and the electromechanical coupling factor K were measured.

An example for comparison will now be described.

A piezoelectric ceramic was produced by depositing a manganese compound on the surface of a piezoelectric ceramic composition without the glass and by performing thermal processing to diffuse the deposited substance into a grain boundary portion.

Specifically, a ceramic in the form of a rectangular plate having a size of 20×30 mm and a thickness of 1 mm was first prepared in the same manner as in the first embodiment.

Meanwhile, paste was produced by mixing only the $MnCO_3$ with varnish. Next, this paste was applied to the surface of the ceramic by means of screen printing, and a piezoelectric ceramic was obtained thereafter in the same manner as in the first embodiment.

The resultant piezoelectric ceramic was cut into a form of a square plate of 5×5 mm and the specific resistance p and the electromechanical coupling factor K were measured.

Figure 2:
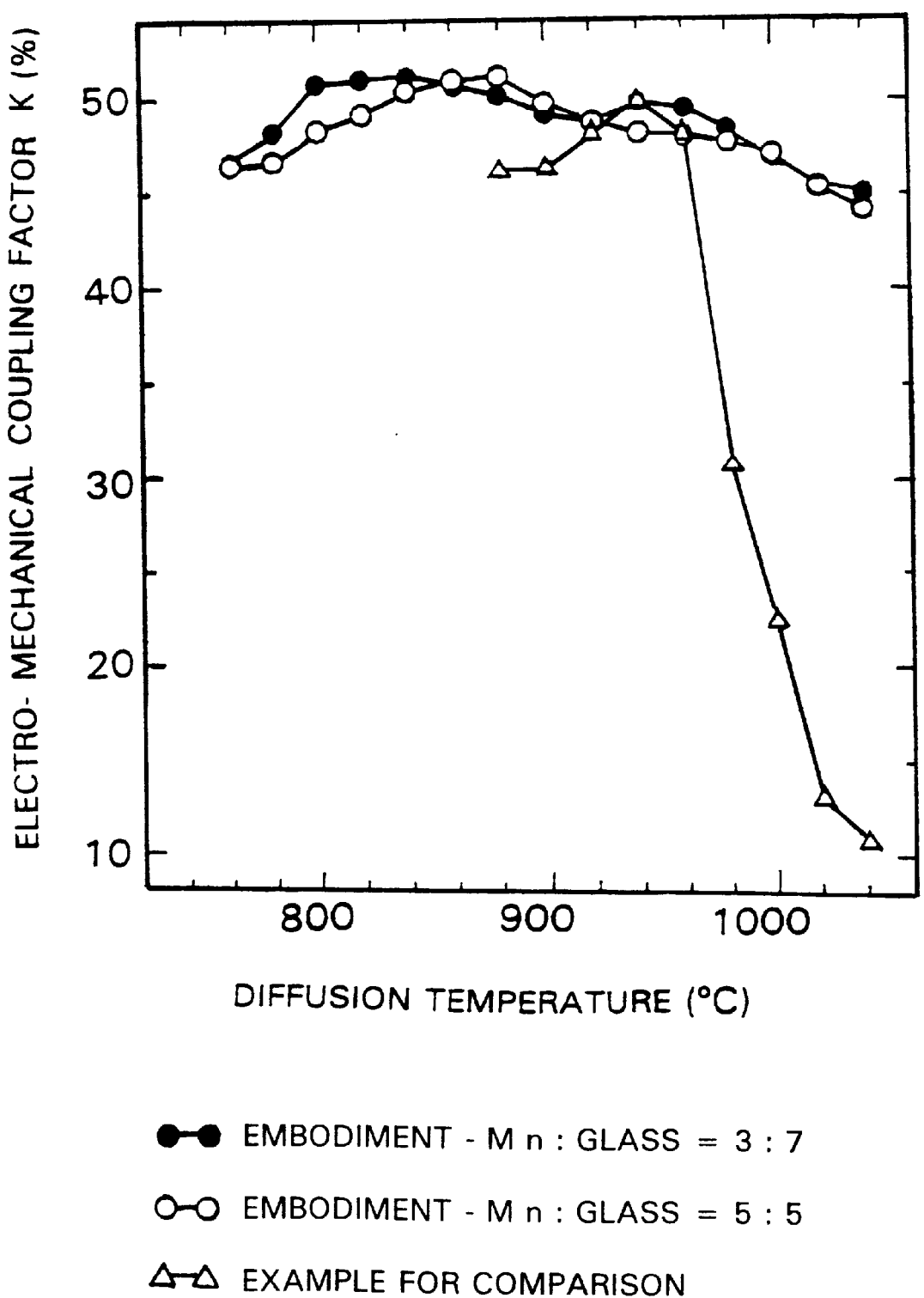
FIG. 2 is a graph showing changes in an electromechanical coupling factor K relative to diffusion temperatures according to the first embodiment of the present invention.
Figure 3:
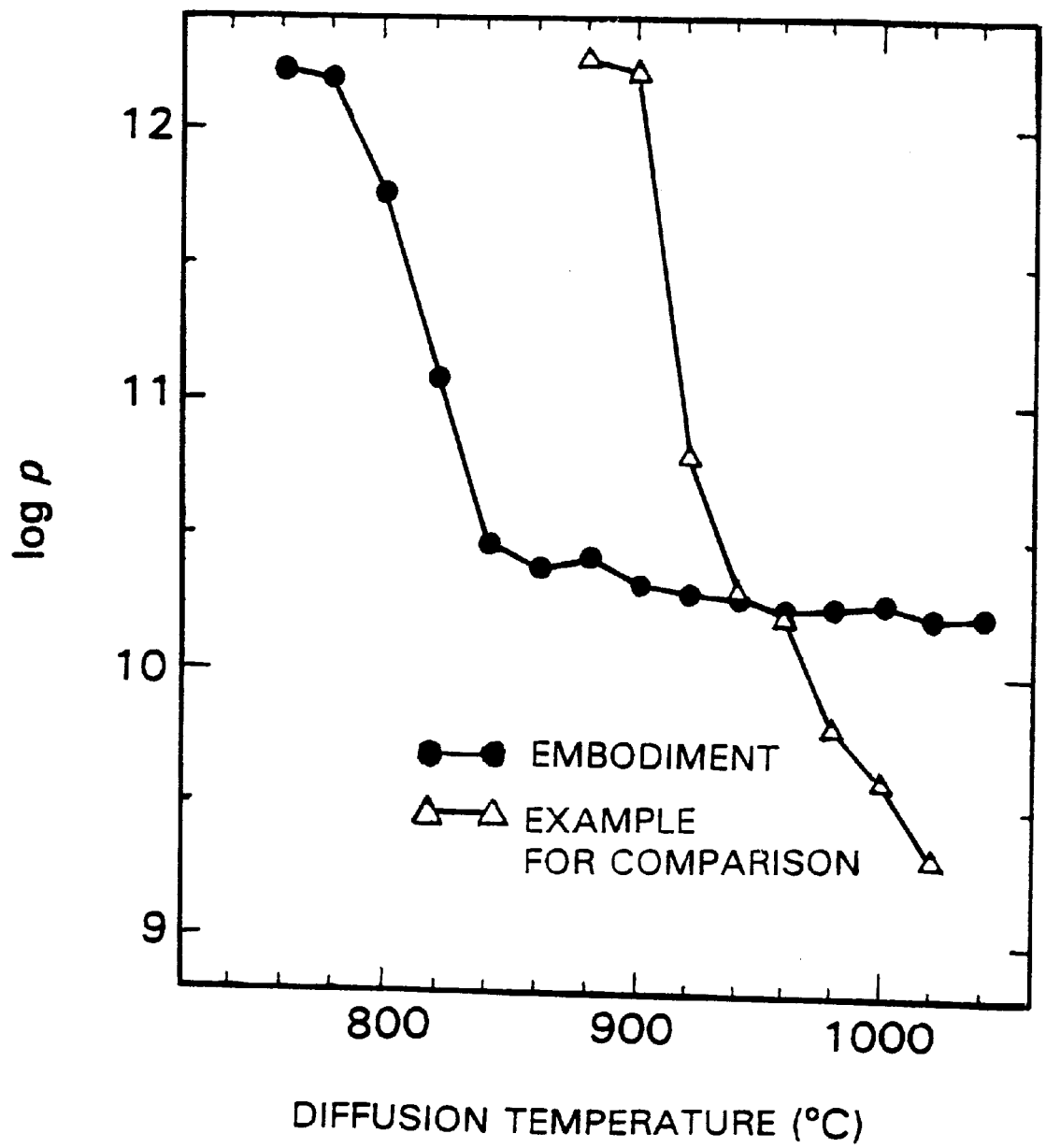
FIG. 3 is a graph showing changes in specific resistance ρ relative to diffusion temperatures according to a second embodiment of the present invention.
Figure 4:
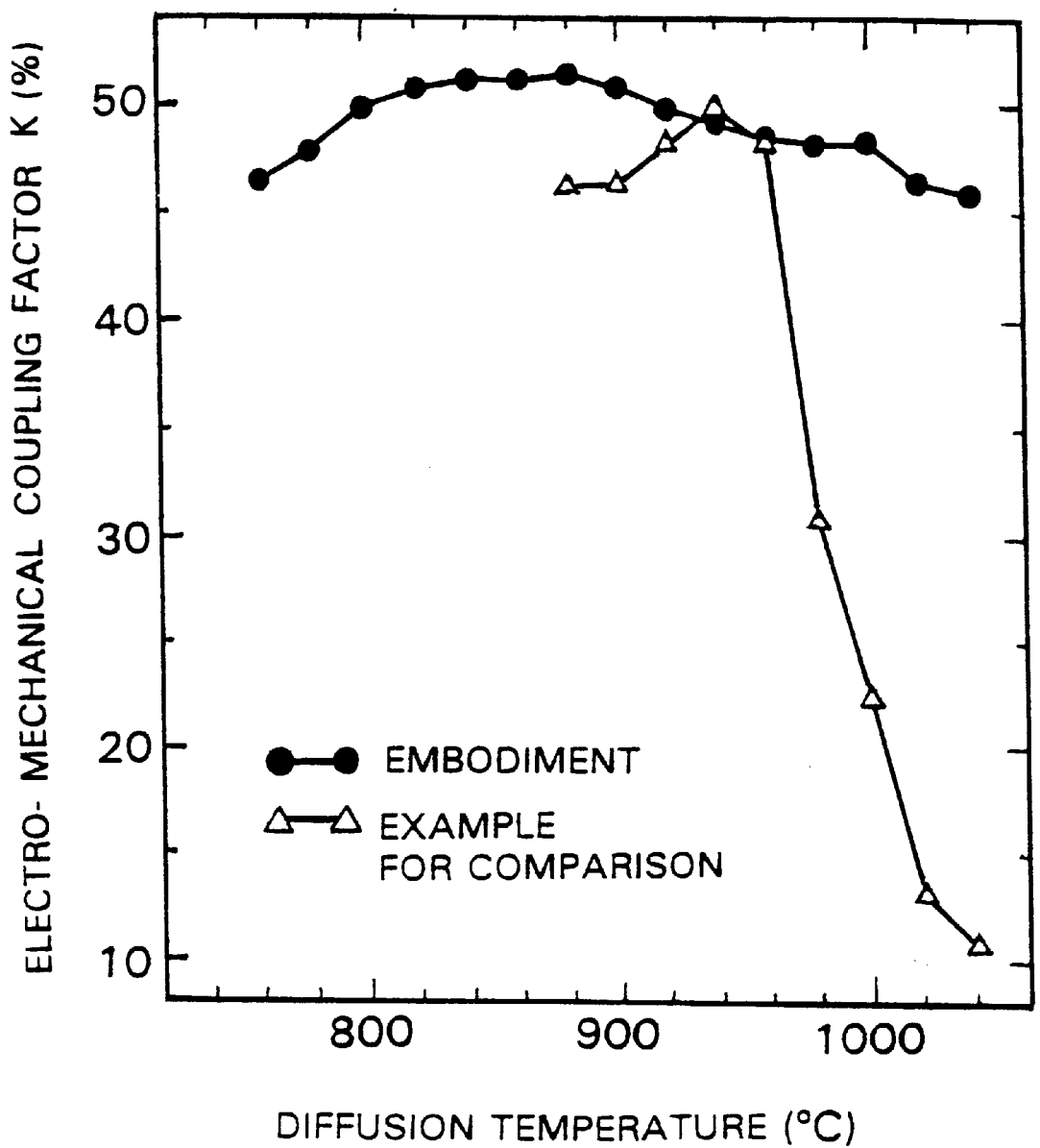
FIG. 4 is a graph showing changes in an electromechanical coupling factor K relative to diffusion temperatures according to the second embodiment of the present invention.

Based on the results of the above-described measurement, FIG. 1 and FIG. 2 respectively show changes in the specific resistance p and the electromechanical coupling factor K relative to the diffusion temperature in the first embodiment and the example for comparison. FIG. 3 and FIG. 4 respectively show changes in the specific resistance p and the electromechanical coupling factor K relative to the diffusion temperature in the second embodiment and the example for comparison.

It is apparent from FIGS. 1 and 3 that in both of the first and second embodiments, the piezoelectric ceramic in which the manganese compound and glass material are thermally diffused exhibit a decrease in the specific resistance ρ at a thermal diffusion temperature lower than that in the example for comparison (in which only the manganese compound was thermally diffused). On the contrary, in the example for comparison, the specific resistance ρ is too low at elevated temperatures. This makes it impossible to apply a polarizing electric field, which results in an abrupt decrease in the electromechanical coupling factor K as apparent from FIGS. 2 and 4.

Further, the specific resistance ρ of a piezoelectric ceramic on which thermal diffusion has been performed is subjected to less fluctuation due to temperature changes during the thermal diffusion process compared to the example for comparison. Therefore, when a thermal diffusion process is performed on a large volume, it is less susceptible to the influence of the temperature distribution of the furnace for the thermal diffusion process and the state of the grain boundary of the ceramic composition.

In addition, it is apparent from FIGS. 2 and 4 that the electromechanical coupling factor K is also at higher values than those in the example for comparison over a wide temperature range in spite of changes in the thermal diffusion temperature.

As described above, according to the present invention, a manganese compound and a glass material are deposited on the surface of a piezoelectric ceramic including at least a composite oxide of lead, zirconium and titanium, and thermal processing is performed thereafter to diffuse the deposited substance in a grain boundary portion of the piezoelectric ceramic. As a result, a piezoelectric ceramic is produced in which an oxide of manganese is distributed in a grain boundary layer at a density higher than that in a crystal grain of the piezoelectric ceramic and a glass phase exists in the grain boundary layer. Therefore, the properties required for a piezoelectric material can be obtained over a range of diffusion temperature in that the specific resistance $\rho$ is low and the electromechanical coupling factor K is great.

Although the paste is applied on the surface of a ceramic using a method of applying it by means of screen printing in the above-described embodiments, the present invention is not limited thereto and, for example, methods of application such as brush painting and spraying may be used.

Further, although a piezoelectric ceramic having a composition of $(Pb_{0.95}Sr_{0.03}La_{0.02})(Zr_{0.51}Ti_{0.49})O_3$ was used in the above-described embodiments, the present invention is not limited thereto and, for example, it may be PZT type ceramics of two-component and three component types having other compositions or those obtained by substituting Sr, Ba, Ca, La and the like for a part of the lead in such materials.

Furthermore, although two types of paste for thermal diffusion including a manganese compound and a glass material in weight ratios of 3:7 and 5:5 were used in the above-described embodiments, the weight ratio between them is not limited to those values and may be arbitrarily set as needed.

In the above embodiments, manganese carbonate was used but the invention is not restricted to this compound. Other Mn compounds, or various combinations thereof, which form the oxides on heating can be used. The heating temperature is generally about 750–1100° C. but the invention is not limited to this range. Preferably, heating is carried out at about 900–960° C. The manganese compound and varnish used heretofor can be employed in this invention by adding a suitable glass thereto. Likewise, the nature of the glass is not restricted to the specific examples above. The amount of manganese compound or manganese oxide present, calculated as manganese dioxide, is generally about 0.005 to 0.5 wt % based on the weight of the ceramic and preferably about 0.005 to 0.3 wt %. The amount of the glass present is generally about 0.001 to 0.5 wt % based on the weight of the ceramic and preferably about 0.001 to 0.3 wt %. The manner in which the magnesium compound and glass are adhered to the surface of the piezoelectric ceramic is also not restricted.

While particular embodiments of the present invention have been shown and described, it will be obvious to those skilled in the art that changes and modifications may be made without departing from the invention in its broader aspects and, therefore, the appended claims are to encompass within their scope all such changes and modifications as fall within the true spirit and scope of this invention.

What is claimed is:

1. A piezoelectric ceramic comprising a composite oxide of at least lead, zirconium and titanium, in which an oxide of manganese exists in a grain boundary layer at a density higher than that in a crystal grain of said piezoelectric ceramic, and in which a lead glass phase exists in said grain boundary layer.

2. A piezoelectric ceramic according to claim 1 in which the ceramic is a PZT ceramic.

3. A piezoelectric ceramic according to claim 2 in which the amount of manganese oxide is about 0.005 to 0.5 wt % calculated as $MnO_2$ and based on the weight of said composite oxide.

4. A piezoelectric ceramic according to claim 3 in which the amount of glass is about 0.001 to 0.5 wt % based on the weight of said composite oxide.

5. A piezoelectric ceramic according to claim 1 in which the amount of maganese oxide is about 0.005 to 0.5 wt % calculated as $MnO_2$ and based on the weight of said composite oxide.

6. A piezoelectric ceramic according to claim 5 in which the amount of glass is about 0.001 to 0.5 wt % based on the weight of said composite oxide.

7. A piezoelectric ceramic according to claim 6 in which the ceramic is a PZT ceramic and the amounts of manganese oxide and glass are about 0.001–0.13 and about 0.005–0.3, respectively.

8. A piezoelectric ceramic according to claim 1 in which the amount of glass is about 0.001 to 0.3 wt % based on the weight of said composite oxide.

9. A piezoelectric ceramic according to claim 8 in which the amount of magnesium oxide is about 0.005 to 0.3 wt % based on the weight of said composite oxide.

10. A manufacturing method for piezoelectric ceramic which comprises heating a piezoelectric ceramic comprising a composite oxide of at least lead, zirconium and titanium having adhered manganese compound and lead glass on a surface thereof at a temperature sufficient to diffuse manganese oxide and glass to grain boundary parts of said piezoelectric ceramic.

11. A manufacturing method for piezoelectric ceramic according to claim 10, in which the ceramic is a PZT ceramic.

12. A manufacturing method for piezoelectric ceramic according to claim 10, wherein said composite oxide is represented by the formula $(Pb_{0.95}Sr_{0.03}La_{0.02})(Zr_{0.51}Ti_{0.49})O_3$.

13. A manufacturing method for piezoelectric ceramic according to claim 10, wherein said manganese compound adhered to the surface is $MnCO_3$.

14. A manufacturing method for piezoelectric ceramic according to claim 10, wherein said composite oxide is heated at about 750° C. to 1100° C.

15. A manufacturing method for piezoelectric ceramic according to claim 10 comprising the step of adhering manganese compound and glass on the surface of the composite oxide.

16. A manufacturing method for piezoelectric ceramic according to claim 15 in which the amount of magnesium compound adhered is about to 0.001 to 0.5 wt % calculated as $MnO_2$ and the amount of glass adhered is about 0.001 to 0.5 wt % based upon the weight of the composite oxide.

17. A manufacturing method for piezoelectric ceramic according to claim 16, wherein said composite oxide is heated at about 750° C. to 1100° C.

18. A manufacturing method for piezoelectric ceramic according to claim 17, wherein said manganese compound adhered to the surface is $MnCO_3$.

19. A manufacturing method for piezoelectric ceramic according to claim 18, wherein said composite oxide is represented by the formula $(Pb_{0.95}Sr_{0.03}La_{0.02})(Zr_{0.51}Ti_{0.49})O_3$.

20. A manufacturing method for piezoelectric ceramic according to claim 18, in which the ceramic is a PZT ceramic.

* * * * *